United States Patent [19]

Samuels

[11] Patent Number: 4,703,283

[45] Date of Patent: Oct. 27, 1987

[54] ISOLATION AMPLIFIER WITH T-TYPE MODULATOR

[76] Inventor: Howard Samuels, 26 Charlotte Rd., Newton, Mass. 02740

[21] Appl. No.: 832,177

[22] Filed: Feb. 24, 1986

[51] Int. Cl.[4] ............................................. H03F 3/38
[52] U.S. Cl. ...................................... 330/9; 330/10; 330/167
[58] Field of Search .......................... 330/9, 165, 167; 332/12; 128/902

[56] References Cited

U.S. PATENT DOCUMENTS

| | | | |
|---|---|---|---|
| 3,334,401 | 11/1967 | Lode | 330/10 |
| 3,416,090 | 12/1968 | Harrison | 330/10 |
| 3,921,088 | 11/1975 | Feucht | 330/9 |
| 3,931,582 | 1/1976 | Kato et al. | 330/10 |
| 3,946,324 | 11/1974 | Smith | 330/10 |
| 4,066,974 | 1/1978 | Reinhard | 330/10 |
| 4,360,784 | 11/1982 | Bartlett | 330/9 |
| 4,383,222 | 5/1983 | Morong, III | 330/10 X |

*Primary Examiner*—James B. Mullins

[57] ABSTRACT

An isolation amplifier including a full-wave modulator which applies to the primary winding of an isolation transformer an attenuated version of the input signal, to reduce the flux density in the transformer without the need for a complicated flux-nulling feedback arrangement. This is a wide-band modulator with means for protection against the adverse effects of thermal drift in the attenuator. Two or more resistors create a resistive divider across the signal and ground terminals of the isolator's input port. A tap on the resistive divider is connected to the input of a first buffer amplifier whose output is connected in series with a capacitor to one lead of the primary winding of the transformer. The signal input is supplied to one throw of an SPDT analog voltage switch, the other throw of which is connected to ground. The pole of the switch is connected to the input of a second buffer amplifier and the output of that buffer is connected to the other lead of the transformer primary. A carrier signal from a carrier source controls the opening and closing of this switch to "chop" the input signal and provide a modulated input to the transformer. A synchronous demodulator connected to the transformer secondary demodulates the chopped input signal.

13 Claims, 1 Drawing Figure

ISOLATION AMPLIFIER WITH T-TYPE MODULATOR

BACKGROUND OF THE INVENTION

1. Field of the Invention

This invention relates, in general, to the field of isolation amplifiers which utilize magnetic (i.e. transformer) coupling. More specifically, however, the invention relates to an isolation amplifier with a modulator for reducing the flux density in the transformer core, to improve linearity.

2. Discussion of the Prior Art

An electrical isolator circuit (also called an isolation amplifier) is a device for transmitting an analog signal from a source circuit or a sensor (connected to the input side of the isolator) to a destination circuit (connected to the output side of the isolator) without permitting a direct flow of current therebetween. Basically, isolators serve two possible roles in their applications environments. First, an isolator may serve as a safety barrier, preventing destructively large or hazardous voltages, applied to the input side of the isolator either intentionally or accidentally, from reaching whatever equipment or persons may be connected to the output, or destination, side of the isolator. Conversely, since the isolation property is bidirectional, the analog signal source may also be protected from potentials which may arise on the output side of the isolator. This is the situation, for example, when an isolator is used in a medical monitoring application. The human patient may be the source of the analog input signal, connected to the input side of the isolator; a medical instrument, such as an electrocardiogram, may be connected to the output side of the isolator. A second possible use for the isolator is to serve as a differential amplifier to extract a desired normal-mode or differential signal from a (possibly much larger) common-mode signal, allowing measurements relatively immune to large potential differences which might exist between a signal source and a measurement system. An isolator also may be used to transfer a signal between two systems which do not share a common ground.

Various types of isolators exist, including isolators which use optical coupling and isolators which employ radio transmission. However, by far the most common are isolators based upon magnetic (i.e. transformer) coupling.

In a magnetic isolator, the input signal (perhaps after some amplification or conditioning) is supplied to the primary winding of an isolation transformer as modulation on a carrier signal. The output signal from the transformer, appearing on its secondary winding, is demodulated in synchronism with the input carrier, to detect the analog input signal.

A variety of modulation schemes are employed. In one technique, referred to as a half-wave isolator, the input signal is chopped by an electronic switch connected in series with the transformer primary. The switch typically is driven by an oscillator carrier signal to close the series circuit to the transformer primary on alternate half-cycles. A corresponding demodulator switch is employed in series with a transformer secondary winding to recover the DC signal level. The demodulator switch is driven by the same oscillator signal as the modulator switch, to establish synchronism between the two switches.

According to another technique, known as double-balanced or full-wave modulation, positive and negative amplitude modulated pulses are supplied to the primary winding of the transformer, in response to the input signal. This method does not require a rectification smoothing circuit or low-pass filter, and therefore has very wide band transmission characteristics.

In many applications of isolators, the precise characteristics of the analog input signal are of interest. There is therefore a great deal of concern about maintaining linearity between input and output signals and with the minimization of drift. Non-linearity and drift introduce unwanted errors into the transfer characteristics of the isolator.

A number of types of errors are attributable to losses occurring in the transformer core. Several mechanisms contribute to such core loss, but all have the property of being substantially proportional in some way to flux density. By minimizing flux (and, thus, flux density), therefore, these losses may be minimized. The problem, of course, is how to get information transmitted through the transformer without significant flux. The first approach taken by prior art designers, referred to as explicit flux nulling, requires the addition of a supplementary secondary transformer winding and a feedback circuit. The supplementary winding is used to sense the presence of flux in the transformer. The signal from the supplementary winding is amplified at high gain and supplied with opposite phase to another winding, to annihilate the original flux created by the input signal. The feedback required to null the input signal is measured and used as an indication of what the input signal must have been. This method was eventually improved by combining the sensing and feedback windings into one. Additionally, improvements were made in the modulation and demodulation techniques, to minimize the effects of switching transients. Regardless of these improvements, however, flux-nuller circuits tend to be subject to thermal drift--that is, they have characteristics which are sensitive to the temperature coefficients of resistors. In particular, they are sensitive to temperature-induced variations of resistors in the feedback circuits.

SUMMARY OF THE INVENTION

In the present invention, an isolation amplifier includes a modulator which reduces the signal amplitude applied to the primary winding of an isolation transformer, to reduce the flux level without the need for a complicated flux-nulling feedback arrangement. The modulator comprises an SPDT analog voltage switch, a carrier signal source, a pair of resistors, a dual operational amplifier, and a single capacitor.

The pair of resistors is used to create a resistive divider across the signal and ground terminals of the isolator's input port. The center tap (or some other intermediate node) of the resistive divider is connected to the input of a first one of the operational amplifiers, which is configured as a follower. The output of that first operational amplifier is connected in series with the capacitor to a first lead of the primary winding of the transformer. The signal input is also supplied to one throw of the analog switch; the other throw of the switch is connected to ground. The pole of the switch is connected to the input of the second operational amplifier, which is also configured as a follower. The output of the second operational amplifier is connected to the second lead of the primary winding of the transformer.

A carrier signal from the carrier signal source controls the operation of the switch, in a conventional manner.

It is accordingly an object of the invention to provide a transformer-coupled isolator circuit which achieves good linearity, using only a two-winding isolation transformer.

Another object of the invention is to provide an improved isolator circuit which reduces the flux level in the isolation transformer without introducing a sensitivity to thermal drift.

Yet another object of the invention is to provide an improved isolator which has a high signal bandwidth.

A still further object of the invention is to provide an improved isolator circuit which provides the foregoing characteristics, or subcombinations of them, without using expensive components.

The foregoing and other objects, aspects, and advantages of the present invention will become apparent from the following detailed description of an illustrative embodiment of the invention, which should be read together with the accompanying drawing. The invention is defined and delimited, however, only by the claims appended hereto.

DETAILED DESCRIPTION OF AN ILLUSTRATIVE EMBODIMENT

Figure 1:
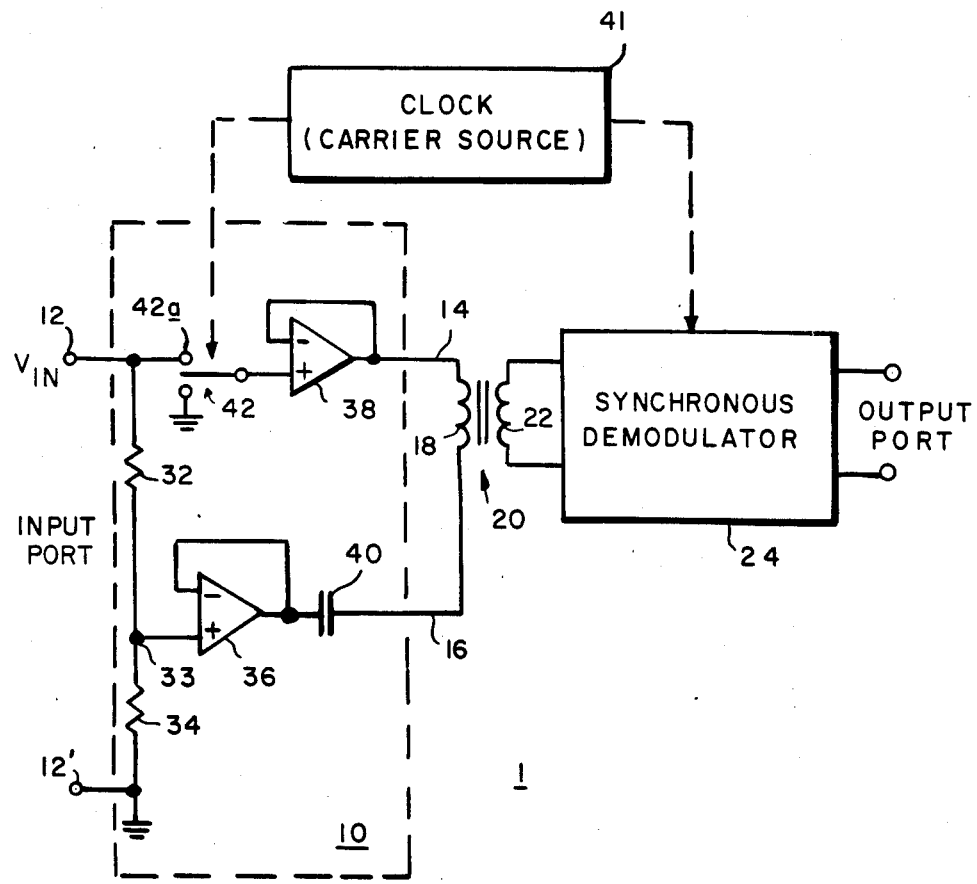
FIG. 1 is a part schematic circuit, part block diagram of the present invention.

Turning to FIG. 1, the isolation amplifier 1 has a modulator circuit 10 connected between a signal input terminal 12 (of an input port 12—12') and first and second leads 14 and 16, respectively, of the primary winding 18 of a coupling transformer 20. The secondary winding 22 of coupling transformer 20 is connected to a synchronous demodulator circuit 24. The details of the demodulator are not part of the present invention and numerous suitable demodulators are well known in the art.

The modulator 10 comprises a resistive divider formed of resistors 32 and 34 connected across the input port (i.e., between signal input terminal 12 and ground terminal 12'), first and second operational amplifiers 36 and 38, coupling capacitor 40 and single-pole, double-throw (SPDT) switch 42. Input terminal 12 is connected to a first lead (i.e., end) of resistor 32 and to one throw of switch 42. The second throw of switch 42 is connected to the signal ground and the single pole of switch 42 is connected to the non-inverting input of op amp 38. Op amp 38 is configured as a voltage follower, or buffer, with its output connected to first lead 14 of primary winding 18 of transformer 20. The node at the junction of resistors 32 and 34 (i.e., the center tap of the resistive divider) is connected to the noninverting input of op amp 36. Op amp 36 is also configured as a voltage follower. Coupling capacitor 40 is placed in series between the output of op amp 36 and the second lead 16 of primary winding 18.

A carrier signal supplied by a conventional carrier source, such as an oscillator 41, drives switch 42. The carrier signal is typically a square-wave, and the switch acts as a so-called "chopper." Switch 42, of course, is typically implemented in this type of application environment using switching transistors; the mechanical switch symbol is employed solely as a functional representation.

Resistive divider 32 and 34 and op amp 36 provide an attenuated version of the input signal to transformer primary lead 16, reducing the effective voltage across the primary winding correspondingly. If resistors 32 and 34 are of equal value, the divider will attenuate the input signal by 50-per cent and the voltage appearing across the transformer primary will be $+/- (V_{in}/2)$, switching polarities during successive half cycles of the oscillator output signal. Thus, this relationship should be maintained in order to achieve full-wave modulation. Should the divider ratio be different, the benefits of full-wave modulation will be lost, at least to some degree. Maximum bandwidth and minimum aliasing are achieved when resistors 32 and 34 are matched.

Certain additional advantages and properties of the modulator can be readily identified on a qualitative basis. Among these properties and advantages are the following: first, since the switch 42 performs the chopping (i.e. modulation) on the input side of the follower 38, there is no switch between that amplifier and the transformer primary. The transformer primary is, therefore, driven at all times and is never open-circuited. Second, op amp 38 essentially performs a voltage-to-current conversion at a.c., after modulation by the carrier. This basically combines the low drift properties of a chopper-stabilized amplifier with the modulation process necessary for transformer coupling. Third, capacitor 40 prevents any d.c. components in the outputs of op amps 36 and 38 from feeding into primary winding 18. Thus, neither d.c. offsets from those op amps nor d.c. voltages induced by any mismatch of resistors 32 and 34 (including mismatch due to thermal drift of their resistances) can saturate the transformer.

The present invention thus provides a full-wave modulator which supplies to an isolation transformer an attenuated version of an input signal while providing high bandwidth, minimum aliasing, and protection for the transformer primary from switching transients and thermal drift. Having described an exemplary circuit providing these properties and advantages, it will be apparent that various alterations, modifications and improvements thereto will readily occur to those skilled in the art of isolator design. Such alterations, modifications and improvements as are within the spirit and scope of the invention, though not expressly discussed above, are intended to be implied. Accordingly, this disclosure is intended to be exemplary and illustrative only, and not limiting. The invention is limited and defined only by the claims appended hereto and their equivalents.

What is claimed is:

1. In an isolation amplifier for providing transmission of a normal-mode input signal from a first, i.e., input, port to a second, i.e., output, port, while providing galvanic isolation between said input port and said output port, such isolation amplifier having an isolation transformer which has primary and secondary windings, a carrier signal source for supplying a periodic carrier signal, a modulator for supplying to the primary winding of the transformer the carrier signal modulated by the input signal, and a demodulator for synchronously demodulating the modulated signal appearing on the secondary winding of the transformer, the improvement comprising the modulator being a full-wave modulator including a. means for supplying to the transformer primary winding an attenuated representation of the input signal waveform wherein said attenuation is at least about fifty-per cent; and b. means to protect the transformer primary winding from the effects of thermal drift in said means for supplying an attenuated representation.

2. In an isolation amplifier for providing transmission of a normal-mode input signal from a first, i.e., input, port to a second, i.e., output, port, while providing galvanic isolation between said input port and said output port, such isolation amplifier having an isolation transformer which has primary and secondary windings, a carrier signal source for supplying a periodic carrier signal, a modulator for supplying to the primary winding of the transformer the carrier signal modulated by the input signal, and a demodulator for synchronously demodulating the modulated signal appearing on the secondary winding of the transformer, the improvement comprising the modulator being a full-wave modulator including a. means for supplying to a first lead of such primary winding the input signal waveform attenuated by at least about fifty-per cent;

b. means for supplying to a second lead of the primary winding during alternating segments of the carrier waveform zero volts and the input signal waveform; and c. means to protect the transformer primary winding from the effects of thermal drift.

3. The improved isolation amplifier of claim 2 wherein the means for supplying to a first lead of the primary winding the attenuated input signal waveform comprises:

(1) a resistive divider connected across the input port; and (2) a buffer amplifier having an input connected to the electrical mid-point of the resistive divider, the output of the buffer amplifier being operatively connected to the first lead of the transformer primary winding.

4. The improved isolation amplifier of claim 3 wherein the means to protect the transformer primary winding from the effects of thermal drift comprises a capacitor connected in series between the output of the buffer amplifier and the first lead of the transformer primary winding.

5. The improved isolation amplifier of claim 4 wherein the means for supplying to the second lead of the primary winding during alternating segments of the carrier waveform zero volts and the input signal waveform comprises:

(1) a second buffer amplifier;

(2) a single-pole, double-throw switch responsive to the periodic carrier signal to switch the pole between first and second throws;

(3) the pole of the switch being connected to the input of the second buffer amplifier;

(4) the first throw of the switch being connected to receive the input signal applied to the input port;

(5) the second throw of the switch being connected to the input signal ground; and (6) the output of the second buffer amplifier being connected to the second lead of the primary winding of the transformer.

6. The improved isolation amplifier of claim 2 wherein the means for supplying to the second lead of the primary winding during alternating segments of the carrier waveform zero volts and the input signal waveform comprises:

(1) a second buffer amplifier;

(2) a single-pole, double-throw switch responsive to the periodic carrier signal to switch the pole between first and second throws;

(3) the pole of the switch being connected to the input of the second buffer amplifier;

(4) the first throw of the switch being connected to receive the input signal applied to the input port;

(5) the second throw of the switch being connected to the input signal ground; and (6) the output of the second buffer amplifier being connected to the second lead of the primary winding of the transformer.

7. An isolation amplifier for providing transmission of a normal-mode input signal from a first, i.e., input, port to a second, i.e., output, port, while providing galvanic isolation between said input port and said output port, comprising:

a. first and second buffer amplifiers;

b. a resistive divider comprising at least first and second resistors;

c. a carrier signal source for supplying a carrier signal;

d. a switch, responsive to the carrier signal, to switch a pole element thereof between first and second throw elements;

e. a capacitor;

f. a transformer having primary and secondary windings;

g. the resistive divider, having its ends connected across the input port;

h. the first terminal of the input port comprising a signal input terminal for receiving the input signal;

i. a second terminal of the input port comprising a common (or ground) terminal;

j. the signal input terminal being connected to a first throw element of the switch;

k. the second throw element of the switch being connected to the common ground;

l. the pole of the switch being connected to the non-inverting input of the first buffer amplifier;

m. the output of the first buffer amplifier being connected to a first lead of the input winding of the transformer;

n. the non-inverting input of the second operational amplifier being connected to a node along the resistive divider; and o. the capacitor being connected in series between the output of the second buffer amplifier and a second lead of the primary winding of the transformer.

8. The isolation amplifier of claim 7 wherein the resistive divider consists of a pair of resistors of the same resistance, whereby full-wave modulation is provided to the primary winding of the transformer.

9. The isolation amplifier of claim 8 further including a synchronous demodulator connected to the secondary winding of the transformer and including a switching element responsive to the carrier signal for synchronously demodulating the waveform induced in the secondary winding.

10. An isolation amplifier for providing transmission of a normal-mode input signal between a first, i.e., input, port and a second, i.e., output, port while maintaining galvanic isolation between said ports, comprising:

a. an isolation transformer having primary and secondary windings; and b. modulator means including (i) means for supplying to a first lead of the primary winding of the isolation transformer a carrier signal modulated by the input signal, (ii) means for providing to a second lead of the primary winding of the transformer an attenuated counterpart of the input signal, and (iii) means for prevent d.c. currents from passing through the primary winding of the transformer.

11. The isolation amplifier of claim 10 wherein the means for providing to the second lead of the transformer an attenuated version of the input signal comprises a resistive divider and a buffer amplifier having an input connected to a point along the resistive divider intermediate the ends thereof, the output of the buffer amplifier being operatively connected to the second lead of the transformer primary.

12. The isolation amplifier of claim 11 wherein the means for preventing d.c. currents from passing through the primary winding of the transformer comprises a capacitor connected in series between the output of the buffer amplifier and the second lead of the primary winding of the transformer.

13. The isolation amplifier of claim 11 wherein the modulator comprises a second buffer amplifier, an oscillator and a single-pole, double-throw switch driven by the oscillator, the switch being connected to chop the input signal at a rate established by the oscillator, the output of the switch being connected to the input of the second buffer amplifier and the output of the second buffer amplifier being connected to the first lead of the primary winding of the transformer.

* * * * *